United States Patent [19]
Tam et al.

[11] Patent Number: 4,825,416
[45] Date of Patent: Apr. 25, 1989

[54] INTEGRATED ELECTRONIC MEMORY CIRCUIT WITH INTERNAL TIMING AND OPERABLE IN BOTH LATCH-BASED AND REGISTER-BASED SYSTEMS

[75] Inventors: Aloysius T. Tam, Sunnyvale; N. Bruce Threewitt, Fremont, both of Calif.

[73] Assignee: Advanced Micro Devices, Inc., Sunnyvale, Calif.

[21] Appl. No.: 860,727

[22] Filed: May 7, 1986

[51] Int. Cl.[4] ............ G11C 7/00; G11C 8/00
[52] U.S. Cl. .................. 365/194; 365/233; 365/189; 365/230
[58] Field of Search ............ 365/189, 194, 230, 233

[56] References Cited
U.S. PATENT DOCUMENTS

| | | | |
|---|---|---|---|
| 4,513,372 | 4/1985 | Ziegler et al. | 365/230 |
| 4,608,669 | 8/1986 | Klara et al. | 365/194 |
| 4,656,612 | 4/1987 | Allan | 365/194 |
| 4,685,088 | 8/1987 | Iannucci | 365/230 X |

FOREIGN PATENT DOCUMENTS

| | | | |
|---|---|---|---|
| 55-38603 | 3/1980 | Japan | 365/194 |
| 58-146088 | 8/1983 | Japan | 365/194 |
| 60-182594 | 9/1985 | Japan | 365/189 |

OTHER PUBLICATIONS

IBM Tech. Discl. Bull., vol. 9, No. 10, Mar., '67, p. 1328, "Memory Clock Design" by Hultman.

Primary Examiner—Stuart N. Hecker
Assistant Examiner—Alfonso Garcia
Attorney, Agent, or Firm—Fliesler, Dubb, Meyer & Lovejoy

[57] ABSTRACT

An integrated electronic memory circuit is provided which includes memory circuitry for storing binary data in an array of memory locations; first data signal providing circuitry for providing input data signals to the memory circuitry, for storage by the memory circuitry as binary data at respective memory locations; and write signal generator circuitry for generating a write signal causing the memory circuitry to accept input data signals from the first data signal providing circuitry for storing in the array.

10 Claims, 7 Drawing Sheets

INTEGRATED ELECTRONIC MEMORY CIRCUIT WITH INTERNAL TIMING AND OPERABLE IN BOTH LATCH-BASED AND REGISTER-BASED SYSTEMS

BACKGROUND OF THE INVENTION

1. Field of the Invention

The present invention relates to electronic memory circuits and more particularly to integrated electronic memory circuits including means for providing input data signals to a memory array and to electronic memory access systems for retrieving data from integrated electronic memory circuits.

2. Description of the Related Art

Electronic memory circuits comprising an electronic memory array for storing binary data in an array of memory locations are well known in the art. Typically, a memory array receives address signals which cause the memory array to generate output data signals corresponding to binary data stored in the array at addressed memory locations. Often, a latch or a register is coupled to the electronic memory array for timing the provision of address signals to the memory array. Similarly, a latch or a register often is coupled to the memory array for receiving the output data signals from the memory array, and for timing their provision, as circuit output signals, to an outside environment.

In the past, sequential electronic logic systems often included diagnostic circuits for detecting and pin-pointing hardware related failures in the system. Broadly speaking, typical earlier diagnostic circuits included means for initializing data input to a system and means for sampling data provided by the system. For example, in one prior system, a diagnostic register was provided which received control data to be input to a sequential system in order to initialize the system for diagnostic purposes. The diagnostic register broke the normal feedback path of the sequential system, and established a logical path in which control signals could be provided to the system and resultant output signals could be sampled. This earlier type of diagnostic register is described in U.S. Pat. No. 4,476,560 issued to Miller et al on Oct. 9, 1984.

Prior electronic memory systems frequently utilized pipelining techniques to increase the speed at which stored binary data could be retrieved from memory. Pipelining techniques often involved the simultaneous performance of a succession of tasks by an electronic memory system upon the provision of appropriate timing signals. For example, while a memory circuit was retrieving binary data stored in a memory array in response to a set of present binary address signals, an input latch or register could be receiving a set of future address signals for provision to the memory circuit, and an output latch or register could be providing system output signals corresponding to a set of previous address signals.

While these earlier electronic memory circuits and electronic memory systems generally have been acceptable, there have been shortcomings with their use. For example, because of the increasing speed with which electronic memory circuits can write data into a memory array and read data from the array, there often was difficulty in providing input data signals to an electronic memory circuit. More specifically, there often were problems providing very short control signals of the general type known as write enable signals, which enable a memory array to write input data into the array.

One illustrative well known type of write enable signal can take on either of two states, LOW or HIGH. During the provision of a LOW write enable signal to a memory array, for example, input data can be written into the array, but output data cannot be read from it. Conversely, during the provision of a HIGH write enable signal, output data can be read from the memory, but input data cannot be written into it.

The advent of increasingly fast memory arrays has led to a decrease in the time required to write input data into such arrays, and as a result, with regard to the illustrative type of enable signal above, correspondingly brief LOW write enable signals are required to write input data into arrays at high speeds. When the time duration of a LOW write enable signal is longer than is required to write data into an array, the reading of data from the array may be unnecessarily slowed because, as mentioned above, output data typically cannot be read from the array during the provision of a LOW write enable signal. Moreover, for some memory arrays, the time required to write input data into an array may be no more than a few nanoseconds. Unfortunately, however, the provision of a LOW write enable signal measuring only a few nanoseconds in time duration can be a difficult task for the user of such an array.

Furthermore, electronic memory circuits of the general type discussed above often suffer from inefficiencies associated with the implementation of the circuits using discrete components. Generally, such circuits were implemented using a discrete input latch or register, a memory array and a discrete output latch or register. A factor which vitiated the integration of these components into a single integrated circuit was the fact that in some applications latches were desired and in others registers were desired. For example, in ECL based systems, a latch often was the preferred means for providing address signals and for receiving output data signals, because in ECL systems, a latch usually experiences approximately one-half the propagation delay of a register. Nevertheless, even in ECL systems, a registered signal often was desired.

Unfortunately, however, latches and registers often are not easily interchangeable. For example, latch outputs typically follow latch inputs when a latch is enabled; that is, the latch appears to be transparent. Register output signals, however, ordinarily change state only at an edge of a clock pulse. Thus, ordinarily a user would use a latch circuit when it was desireable for output signals to follow input signals, and he would use a register circuit when it was desirable for output signals to change state only at an edge of a clock pulse.

Thus, there exists a need for an integrated electronic memory circuit in which input data signals can be easily written into a memory array in a relatively short time period and which includes elements which alternatively can act like a latch or like a register. The present invention meets these needs.

SUMMARY OF THE INVENTION

The present invention comprises a novel integrated electronic memory circuit. The circuit comprises a memory array for storing binary data in an array of memory locations. A data signal providing circuit provides input data signals to the memory array for storage by the array as binary data at respective memory locations. Furthermore, a write signal generator generates a write signal causing the array to accept input data signals from the data signal providing circuit and to store binary data, corresponding to respective input data signals, in the memory array.

Another aspect of the invention comprises a novel electronic memory access system. The system comprises a timing signal control circuit which provides first and second timing signals. The system also includes an integrated circuit. The integrated circuit includes: a memory array for storing binary data in an array of memory locations and for providing respective output data signals corresponding to binary data stored in corresponding respective memory locations, and an output latch circuit for receiving the output data signals from the memory circuit and for providing system output signals in response to the first timing signals. The system also advantageously may comprise an input latch circuit for receiving address information and for subsequently providing the address information to the memory locations, the input latch also responsive to timing signals provided by the timing signal control circuit. A sequencer circuit responsive to the second timing signals is included and provides to the memory circuit a sequence of respective address signals corresponding to a sequence of memory locations to be addressed in the memory array.

Thus, the integrated electronic memory circuit of the present invention includes a write signal generator circuit which internally generates a write enable signal causing the memory array to write input data into the array. The provision of the write signal generator circuit substantially frees a user from undertaking the task of generating external write enable signals, which for high speed memories, can be a difficult task.

The electronic memory system of the present invention is a versatile system in which either latch can be made to function as if it were a register. Further, two latches can be combined to serve as a single register. Thus, the system is applicable to both latch-based and register-based systems. Furthermore, the system can utilize both single-level and double-level pipelining techniques.

These and other features and advantages of the present invention will become more apparent from the following description of exemplary embodiments thereof, as illustrated in the accompanying drawings.

BRIEF DESCRIPTION OF THE DRAWINGS

The purpose and advantages of the present invention will be apparent to those skilled in the art from the following detailed description in conjunction with the appended drawings in which.

DETAILED DESCRIPTION OF THE PREFERRED EMBODIMENTS

The present invention comprises a novel integrated electronic memory circuit and a novel electronic memory system. The following description is presented to illustrate the best mode presently contemplated by the inventors for practicing the invention. The description will enable any person skilled in the art to make and use the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

The Integrated Electronic Memory Circuit

Figure 1:
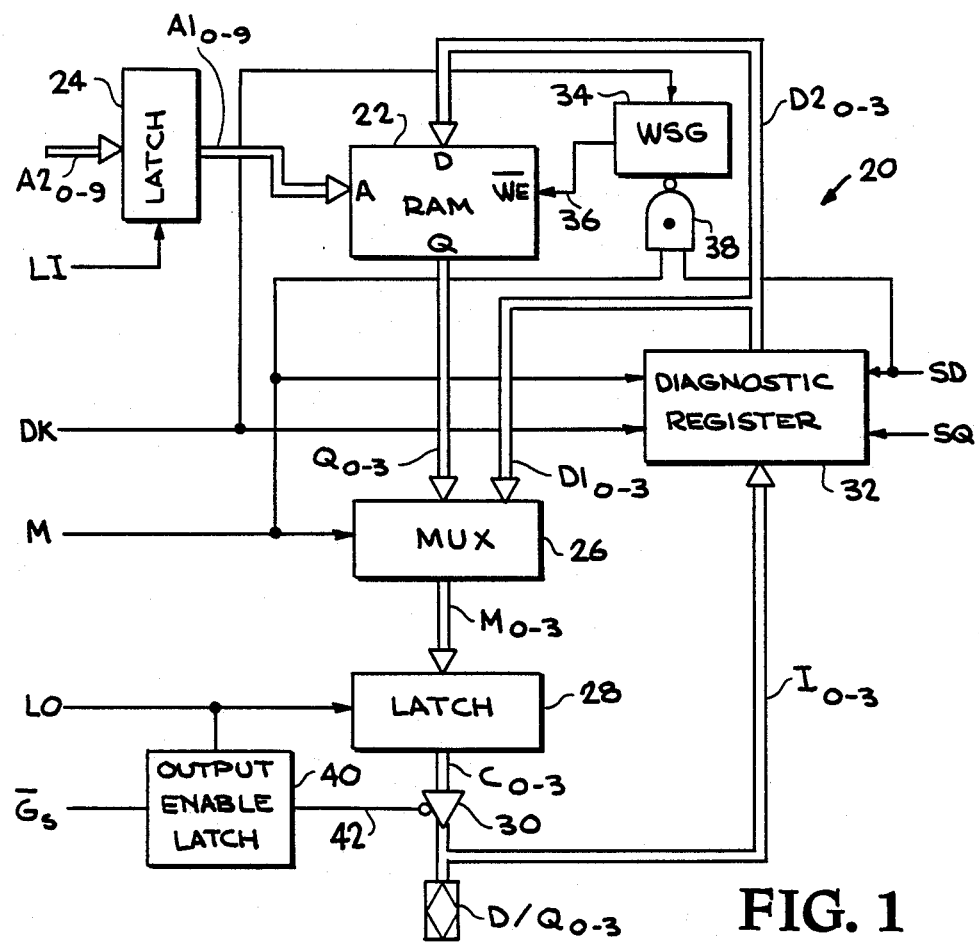
FIG. 1 is a schematic diagram of a first embodiment of an electronic memory circuit of the present invention.

Referring now to FIG. 1, there is shown an illustrative schematic diagram of a first embodiment comprising a first integrated electronic memory circuit 20 of the present invention. The first electronic memory circuit 20 includes a random access memory array 22. The array 22 includes ten address terminals denoted collectively by the letter A, four output terminals denoted collectively by the letter Q, four input terminals denoted collectively by the letter D and a terminal denoted by the letters $\overline{WE}$. A first latch circuit 24 is coupled by address input lines denoted $A1_{0-9}$ to respective address terminals, A, of the random access memory array 22. A multiplexer circuit 26 is coupled to the data output terminals, Q, of the random access memory array 22 by respective lines labelled $Q_{0-3}$. The multiplexer circuit 26, in turn, is coupled to a second latch circuit 28 by respective lines labelled $M_{0-3}$. The second latch 28 is coupled to an output buffer circuit 30 by respective lines denoted $C_{0-3}$. The output buffer circuit 30 provides four respective output lines to nodes labelled $DQ_{0-3}$. Each respective output line is coupled to a respective input line $I_{0-3}$ which are provided to a diagnostic register 32. The diagnostic register 32 provides respective input data signals on two sets of respective branch lines. First branch lines $D1_{0-3}$ are coupled to the multiplexer circuit 26 to provide one set of input data signals thereto, and second branch lines $D2_{0-3}$ are coupled to respective D input terminals of the random access memory array 22. A write signal generator circuit 34 is coupled by line 36 to the $\overline{WE}$ terminal of the array 22. An output terminal of a NAND gate 38 is coupled to the write signal generator circuit 34.

The first integrated electronic memory circuit 20 includes further input lines extending between pin terminals of the circuit 20 and various elements of the system. These lines are depicted in FIG. 1, and their operation in controlling the function of various elements will be described hereinafter in conjunction with a functional description of the operation of the first circuit 20.

In a presently preferred embodiment, the random access memory array 22 is a 1K×4 array adapted to store 1024 four-bit bytes of binary data. It will be appreciated, however, that a memory array having a different memory density such as, for example, 4K×4 can be incorporated, and other elements of the integrated electronic memory circuit can be correspondingly modified to process signals to and from such a memory array without departing from the spirit and scope of the invention.

The first latch 24 receives address signals on lines labelled $A2_{0-9}$. When signal LI is HIGH, the first latch is transparent, and the first address signals will pass through the first latch 24 to lines $A1_{0-9}$ for provision to the A terminals of the random access memory array 22. When LI is LOW the first latch 24 disregards any changes in the address signals on lines $A2_{0-9}$, and the address terminals, A, of the random access memory array 22 remain unaffected by such changes. Thus, when LI is LOW, a previously latched address field persists at address terminals, A, and when LI is HIGH, the first latch 24 provides a new 10-bit address field on lines $A1_{0-9}$ to the address terminals, A. The random access memory array 22 decodes the address field in a manner well known to those skilled in the art to select one of the 1024 memory locations in the array 22.

The multiplexer circuit 26 selects either the data output signals on lines $Q_{0-3}$ or the data input signals on first branch lines $D1_{0-3}$ depending on the state of the Mode signal, M. When M is LOW, output data signals on lines $Q_{0-3}$ are selected, and when M is HIGH, data input signals on the first branch lines, $D1_{0-3}$ are selected.

The operation of the second latch 28 is substantially controlled by the state of the L0 signal. When signal L0 is HIGH, the second latch 28 becomes transparent and transfers data signals on multiplexer lines $M_{0-3}$ to the output buffer circuit 30 via lines $C_{0-3}$. When signal L0 is LOW, the second latch 28 holds the previously latched signals on lines $C_{0-3}$ substantially constant, ignoring any changes in signals on lines $M_{0-3}$.

The operation of the diagnostic register 32 is substantially controlled by the data clock, DK. The diagnostic register 32 can receive data input signal bits in a serial fashion on line SD or can receive data input bits in a parallel fashion on lines $I_{0-3}$.

It will be appreciated that nodes $DQ_{0-3}$ are bi-directional. When output buffer 30 is enabled, output signals can be provided via lines $C_{0-3}$. Alternatively, when output buffer 30 is disabled, data input signal bits can be provided in a parallel fashion to the diagnostic register 32 via lines $I_{0-3}$. Output enable latch 40, which is coupled to receive the L0 signal and to receive a synchronous output enable signal, $\overline{G_s}$, provides to the output buffer circuit 30 control signals on line 42 which determine whether the output buffer circuit 30 is enabled or disabled, as will be described more fully below.

In order to load the diagnostic register 32 in a serial fashion from line SD, M must be LOW in which case, the diagnostic register 32 shifts data serially on the rising edge of a data clock signal, DK. A data bit entering at SD at a first leading edge of signal DK will emerge from the diagnostic register 32 at SQ after three more leading edges of signal DK.

Alternatively, data input signal bits, can be loaded into the diagnostic register 32 in a parallel fashion on lines $I_{0-3}$ from the second latch 28. This operation requires signal M to be HIGH, an SD input to be LOW, and signal $\overline{G_s}$ to be arising from a valid LO strobe in a previous cycle. When these conditions are present, the rising edge of signal DK causes the contents of the second latch 28 to be loaded into the diagnostic register 32.

In still another alternative, data input signal bits can be loaded into the diagnostic register 32 in a parallel fashion from nodes $DQ_{0-3}$ on lines $I_{0-3}$. In order to achieve loading of the diagnostic register 32 from nodes $DQ_{0-3}$, signal M must be HIGH, SD must be LOW, and signal $\overline{G_s}$ must be HIGH, arising from a valid LO strobe in a previous cycle. When these conditions are present, data input signal bits will be loaded in a parallel fashion on lines $I_{0-3}$ into the diagnostic register 32 on the rising edge of signal DK.

The diagnostic register 32, in addition to being able to load its contents in parallel via the first branch lines $D1_{0-3}$ to the multiplexer circuit 26, alternatively can load its contents, via the second branch lines $D2_{0-3}$, to the random access memory array 22. In order to achieve the loading of data input signals from the diagnostic register 32 to the random access memory array 22 via the second branch lines $D2_{0-3}$, signals M and SD both must be HIGH. When these conditions are present, the diagnostic register 32 will load its contents into the random access memory array 22 on the rising edge of DK. The memory location in the array 22 to which the data bits from the diagnostic register 32 are written is determined by the 10-bit address field provided to address terminals, A, of the memory array 22.

Figure 3:
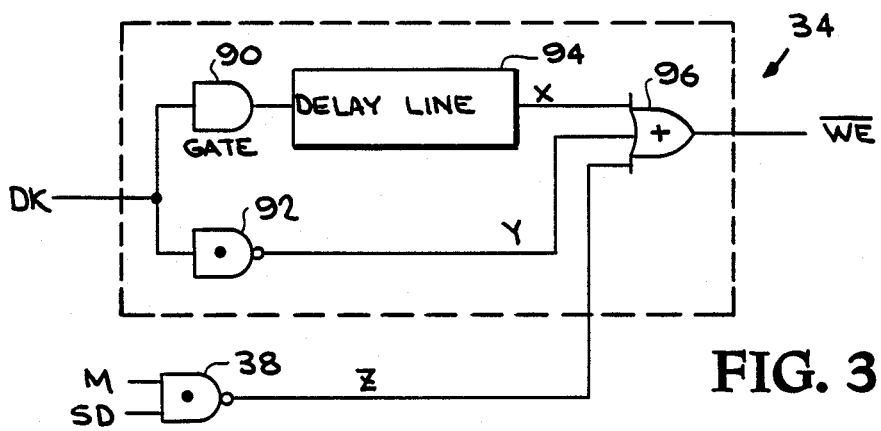
FIG. 3 is a logic diagram of a write signal generator of the embodiment of FIG. 1.

Referring now to the logic diagram of FIG. 3, there are shown details of the write signal generator 34 within the dashed lines. The write signal generator 34 comprises a first gate 90 and a second gate 92, each coupled respectively to receive the data clock signal, DK. The first gate 90 includes an output terminal coupled to a delay line 94, and the delay line 94 includes an output terminal coupled by line X to a first input terminal of an OR gate 96. The second gate 92 includes an output terminal coupled by line Y to a second input terminal of the OR gate 96. The NAND gate 38 is coupled by line Z to a third input terminal of the OR gate 96.

The delay line 94 is a well known device which comprises a series of gates (not shown) each of which is similar to the first gate 90. The number and type of gates comprising the delay line 94 is selected in a manner well known to those skilled in the art such that signals provided at an output terminal of the first gate 90 will be delayed for a desired period of time before their appearance on line X at the first input terminal of the OR gate 96.

The memory array 22 is enabled to write input data provided on the second branch lines $D2_{0-3}$ by the diagnostic register 32 when the write enable signal $\overline{WE}$ is LOW. Thus, from the logic diagram of FIG. 3, it will be appreciated that signals on lines X, Y and Z all must be LOW in order for the write enable signal $\overline{WE}$ to be in a LOW state so that input data may be written into the memory array 22.

Figure 4:
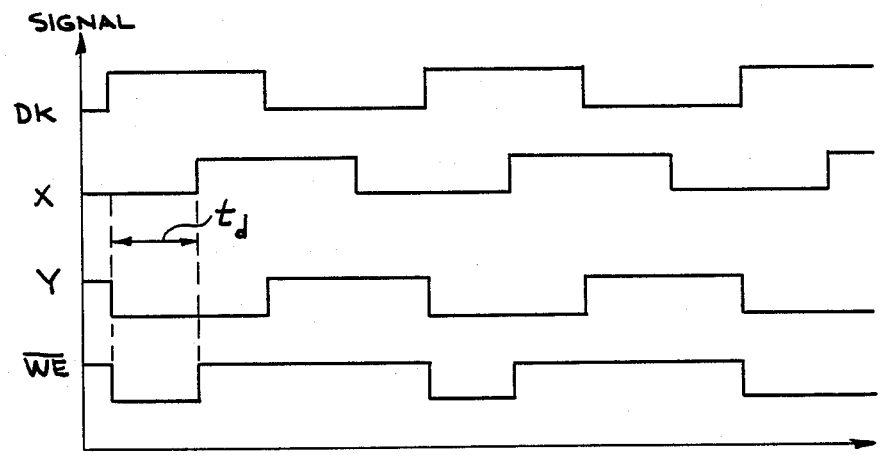
FIG. 4 is a timing diagram for the write signal generator of FIG. 3.

The operation of the write signal generator 34 will be better understood by reference to the timing diagram of FIG. 4. A time interval $t_d$ represents the length of the time delay introduced by the delay line 94. During the time period when the signal DK is LOW, the $\overline{WE}$ signal is HIGH because the second gate 92 acts as an inverter and provides a HIGH signal on line Y. When the DK signal transitions to a HIGH state, however, the $\overline{WE}$ signal transitions to a LOW state and remains in the LOW state for a period of time equal to $t_d$; whereupon it transitions to a HIGH state because of the arrival of a HIGH signal on line X. The arrival of a HIGH signal on line X, of course, is delayed for a period equal to $t_d$ because of the action of the delay line 94.

Figure 5:
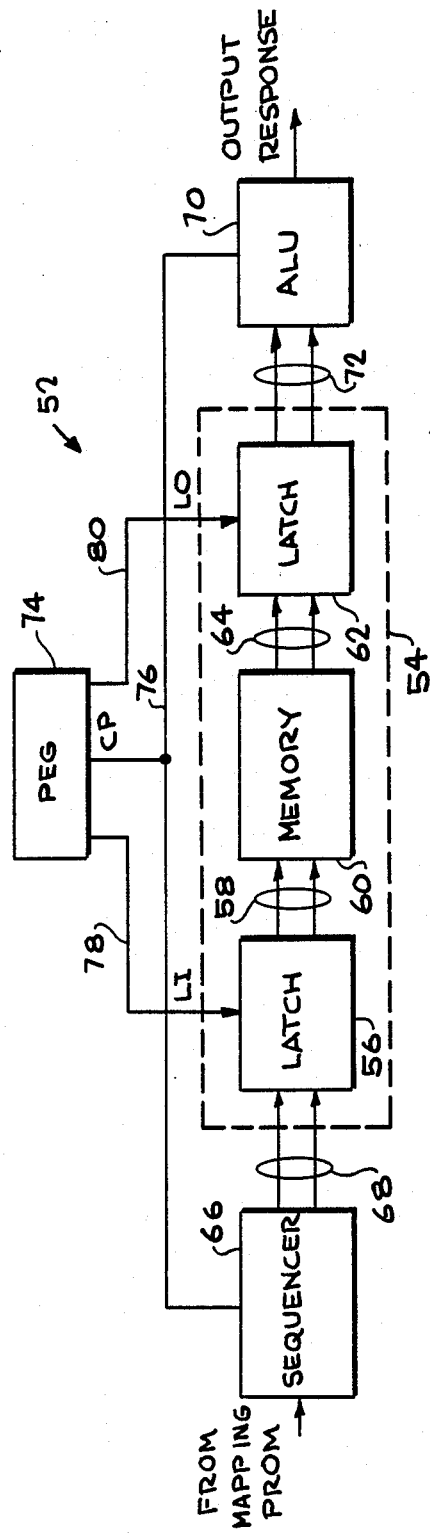
FIG. 5 is a block diagram of an embodiment of an electronic memory access system of the present invention.

It will be appreciated that a $\overline{WE}$ signal in the LOW state will occur only when a signal on line Z also is in a LOW state, and that during the entire time interval illustrated in FIG. 5, it is assumed that the signal on line Z is in fact in a LOW state. Thus, the M and SD signal inputs to the NAND gate 38 also contribute to the control of the state of the $\overline{WE}$ signal. Consequently, the M and SD signals can be provided such that the $\overline{WE}$ signal is in a LOW state only when input data signals are to be provided on the second branch lines $D2_{0-3}$ by the diagnostic register 32 to the memory array 22, regardless of the state of signal DK.

Thus, the novel write signal generator 34 advantageously provides a LOW state write enable signal $\overline{WE}$ characterized by a prescribed time period. The prescribed time period of the presently preferred embodiment has a time duration substantially equal to the time delay introduced by the delay line 94. Furthermore, the LOW state write enable signal $\overline{WE}$ will be provided only when appropriate M and SD signals are provided to the NAND gate 38, as for example, when input data from the diagnostic register 32 is ready to be written into the memory array 22.

Therefore, a user need only apply an appropriate DK signal and M and SD signals. The write signal generator 34 internally generates the LOW state $\overline{WE}$ signal. One will appreciate that the length of the time delay introduced by the delay line 94 can be advantageously chosen such that the time period of a LOW state $\overline{WE}$ signal substantially equals the time necessary to write input data into the memory array 22. Thus, the reading of data during high-speed operation of the memory array 22 and its provision as output data signals on lines $Q_{0-3}$ is not unduly delayed by interruptions for the writing of data into the array 22, and the user need not undertake for himself the relatively difficult task of generating the relatively short LOW state $\overline{WE}$ signals which make such high-speed operation possible.

Truth Tables 1 and 2 below summarize the operation of the first integrated electronic memory circuit 20. Table 1 illustrates circuit operations controlled by LO signals, and Table 2 illustrates operations controlled by DK signals.

The following symbols pertain to the Truth Tables: H=HIGH, L=LOW, X=Don't Care, PP=positive pulse, LHT=low-to-high transition.

TABLE 1

| LO | M | $\overline{G}_S$ | $DQ_{0-3}$ | OPERATIONS |
|---|---|---|---|---|
| PP | L | L | ENABLE | Load Second Latch |
| PP | L | H | DISABLE | From Memory Array |
| PP | H | L | ENABLE | Load Second Latch |
| PP | H | H | DISABLE | From Diagnostic Reg. |

TABLE 2

| DK | M | SD | $\overline{G}_S$ | OPERATIONS |
|---|---|---|---|---|
| LHT | H | H | X | Write Into Memory Array |
| LHT | L | X | X | Shift Diagnostic Register Right (SD→S0→S1→S2→S3→SQ) |
| LHT | H | L | L | Load Diagnostic Register From Second Latch |
| LHT | H | L | H | Load Diagnostic Register From $DQ_{0-3}$ |

Figure 2:
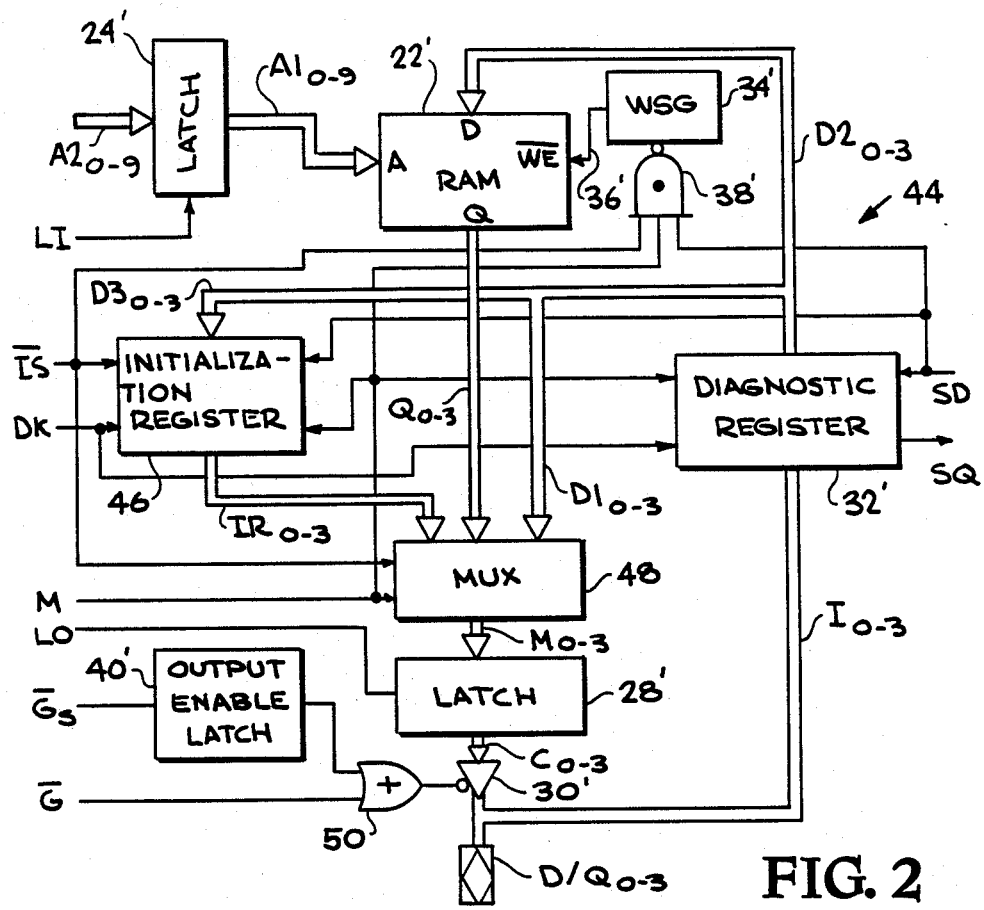
FIG. 2 is a schematic diagram of a second embodiment of an electronic memory circuit of the present invention.

Referring now to the illustrative drawings of FIG. 2 there is shown a schematic diagram of a second embodiment illustrating a second integrated electronic memory circuit 44 of the present invention. It will be appreciated that many of the components of the second circuit 44 are substantially identical to those of the first circuit 20. Consequently, elements of the second circuit 44 which are substantially identical to those of the first circuit 20 are denoted by primed reference numerals identical to those of the corresponding elements of the first circuit 20. The description of the second circuit 44 will be limited to details which differ substantially from the first circuit 20.

More particularly, the second circuit 44 includes an initialization storage register 46 coupled by third branch lines $D3_{0-3}$ to receive control input signals from the diagnostic register 32'. The initialization storage register 46 is coupled by lines $IR_{0-3}$ to a multiplexer circuit 48. The initialization storage register 46, like the diagnostic register 32', can hold four data bits. Of course, however, the size of both the initialization storage register 46 or the diagnostic register 32' varied according to the needs of a particular application. Data can be transferred in a parallel fashion on third branch lines $D3_{0-3}$ from the diagnostic register 32' to the initialization storage register 46, and data can be transferred in a parallel fashion on lines $IR_{0-3}$ from the initialization storage register 46 to the multiplexer 48.

More particularly, when both signals M and SD are HIGH and signal $\overline{IS}$ is LOW, the contents of the diagnostic register 32' will be provided on third branch lines $D3_{0-3}$ upon the LOW-to-HIGH edge of clock signal DK. Alternatively, when both signals M and $\overline{IS}$ are LOW, the contents of the initialization storage register 46 will be provided on lines $IR_{0-3}$ and passed through multiplexer 48 to lines $M_{0-3}$ and loaded into second latch 28' upon the occurrence of a HIGH pulse of the LO signal.

A third input signal, the $\overline{IS}$ signal, is provided to NAND gate 38' in addition to the M and SD inputs, but otherwise, its operation is analogus to that described above for NAND gate 38.

The second embodiment 44 also includes an OR logic gate 50 having an output terminal coupled to an output buffer circuit 30'. The OR logic gate 50 receives a synchronous enable signal $\overline{GS}$ via output enable latch 40' and receives an asynchronous enable signal $\overline{G}$ at its other input terminal.

It will be appreciated that the addition of the initialization storage register 46 and the asynchronous enable signal $\overline{G}$ has required some modification in the various lines extending between pin terminals of the circuit 44 and various elements of the system. These modifications are apparent from the drawings of FIG. 2 and the description above and need not be further described herein.

Truth Tables 3 and 4 below summarize the operation of the second integrated electronic memory circuit 44. Table 3 illustrates circuit operations controlled by LO signals, and Table 4 illustrates circuit operations controlled by DK signals.

The symbols used in Tables 3 and 4 are the same as those of the Tables above.

TABLE 3

| LO | $\overline{G}$ | $\overline{I_S}$ | M | $\overline{G_S}$ | $DQ_{0-3}$ | OPERATIONS |
|---|---|---|---|---|---|---|
| PP | L | L | L | L | ENABLE | Load Second Latch |
| PP | X | L | L | H | DISABLE | From Init. Register |
| PP | L | H | L | L | ENABLE | Load Second Latch |
| PP | X | H | L | H | DISABLE | From Memory Array |
| PP | L | X | H | L | ENABLE | Load Second Latch |
| PP | X | X | H | H | DISABLE | From Diag. Register |
| X | H | X | X | X | DISABLE | Outputs Disabled |

TABLE 4

| DK | M | SD | $\overline{G_S}$ | OPERATIONS |
|---|---|---|---|---|
| LHT | H | H | X | Write Into Array From Diagnostic Reg. When IS = H Write Into Init. Register From Diagnostic Reg. When IS = L |
| LHT | L | X | X | Shift Diagnostic Reg. (SD→S0→S1→S2→S3→SQ) |
| LHT | H | L | L | Load Diagnostic Reg. From Second Latch ($\overline{G}$ = L, Outputs Enabled) |
| LHT | H | L | H | Load Diagnostic Reg. From $DQ_{0-3}$ ($\overline{G}$ = X) |

The integrated electronic memory circuit of the present embodiments 20, 44 advantageously provide a diagnostic register 32, 32' which can be used to break the normal signal path of data flowing from a random access memory array 22, 22' so that data input signals can be provided to the array 22, 22' or the second latch 28, 28', and resultant output signals provided by the array 22, 22' or the second latch 28, 28' can be sampled for diagnostic purposes.

The novel write signal generator 34, 34', as described above, can internally generate LOW state $\overline{WE}$ signals having a prescribed time period substantially equalling a time required to write data from the diagnostic register 32 into the array. It will be appreciated, of course, that the write signal generator 34, 34' can be modified to provide very short HIGH state $\overline{WE}$ signals for use with alternative memory arrays (not shown) which write data during the provision of HIGH state $\overline{WE}$ signals.

Moreover, the second circuit 44 includes an initialization storage register 46 which can store four data bits which, for example, can be accessed in the event of an unexpected failure in the circuit. The data bits stored in the initialization storage register 46, for example, can be used to instruct a computer (not shown), coupled to the circuit 44 and using data stored in the random access memory array 22', to jump to another memory circuit (not shown).

The Electronic Memory System

Referring now the illustrative block diagram of FIG. 5, there is shown a presently preferred electronic memory access system 52 of the present invention. The system 52 is constructed using ECL logic technology and includes, enclosed within dashed lines 54, an integrated electronic memory circuit. The integrated electronic memory circuit includes a first latch 56 for providing on lines 58 ten-bit address signals to a memory array 60. The memory array 60, for example, can be a random access memory such as that described above or a read-only memory. The circuit also includes a second latch 62 for receiving four-bit output data signals from the memory array 60 on lines 64.

An ECL sequencer 66 is coupled on lines 68 to the first latch 56, and an arithmatic logic unit (ALU) 70 is coupled on lines 72 to the second latch 62. An ECL programmable event generator 74 provides clock pulse signals, CP, on line 76 to the sequencer 66 and the ALU 70, and it provides LI signals on line 78 to the first latch 56, and LO signals on line 80 to the second latch 62.

In the presently preferred embodiment, the system 52 is implemented with ECL logic. However, implementation with other logic families such as TTL logic is possible.

Figure 6:
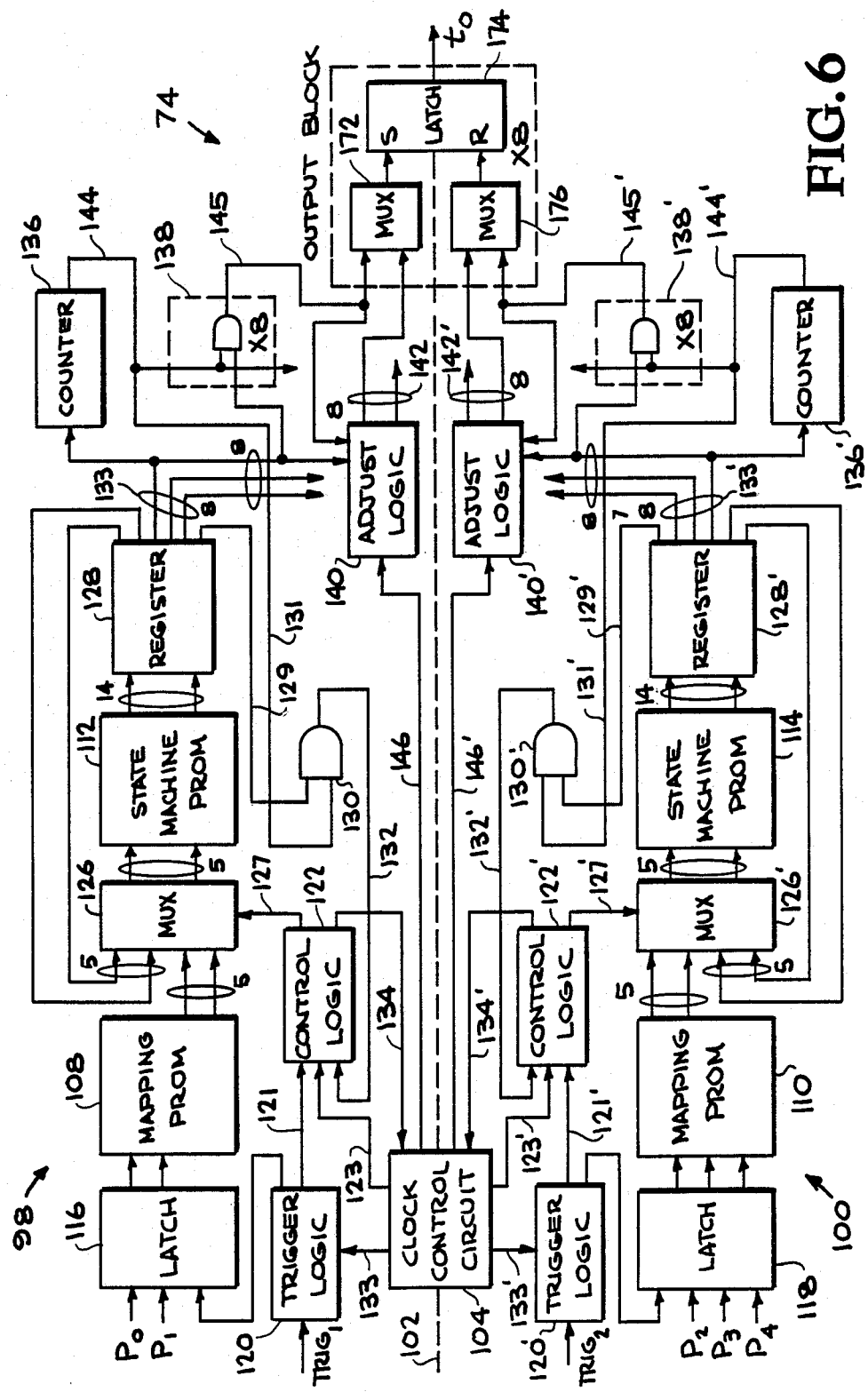
FIG. 6 is a block diagram of a programmable event generator of the embodiment of FIG. 5.
Figure 7:
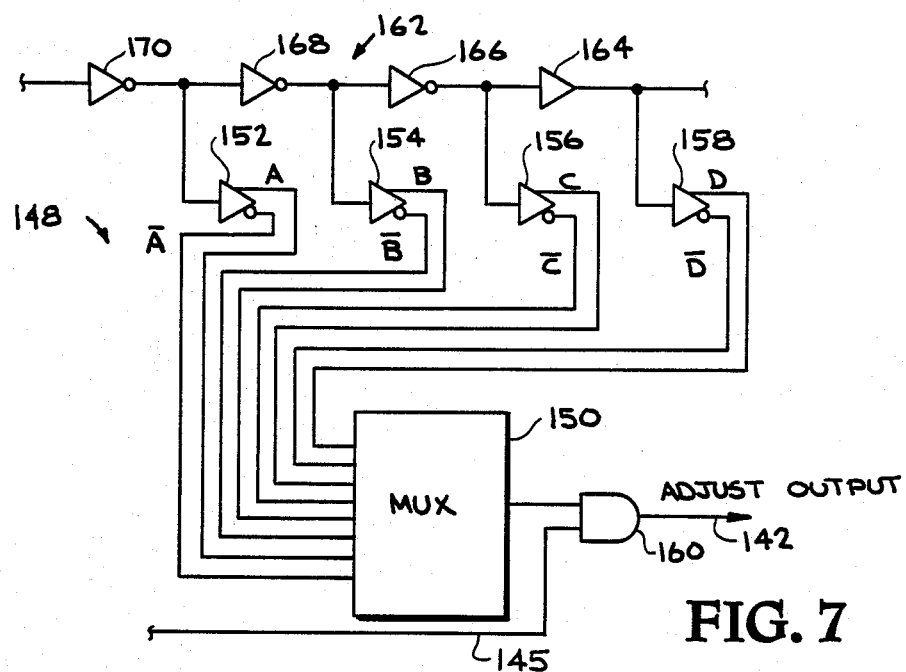
FIG. 7 is a schematic diagram of a logic section an adjust logic circuit of the programmable event generator of FIG. 6.
Figure 8:
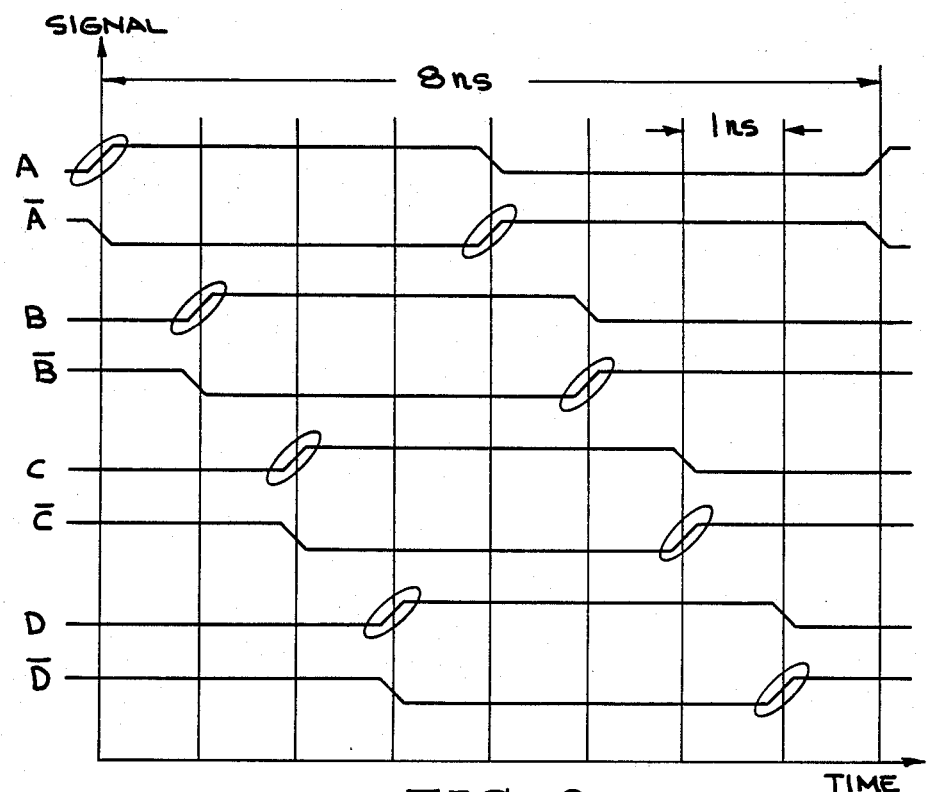
FIG. 8 is a timing diagram of the logic section of FIG. 7.

In operation, the ECL programmable event generator 74 provides clock pulse signals CP, and LI and LO signals. FIGS. 6, 7 and 8 illustrate details of the ECL programmable event generator 74 and its operation. The programmable event generator 74 includes an upper section indicated generally by the numeral 98 and a substantially similar lower section indicated generally by the numeral 100. These sections, 98 and 100, are substantially symmetrical about dashed line 102. The upper and lower sections 98 and 100, respectively, share a common clock control circuit 104 and eight output blocks 106 (only one of which is illustrated). The respective upper and lower sections 98 and 100 cooperate, as will be explained more fully below, to provide as many as eight output signal waveforms on eight separate output lines (only one of which is shown) such as the one line labelled $t_0$.

The following functional description of the programmable event generator 74 begins with a brief overview of its operation. Mapping PROMs 108 and 110, respectively, store binary pointer words which point to memory locations in respective state machine PROMs 112 and 114. Upper mapping PROM 108 can store four five-bit pointer words, and lower mapping PROM 110 can store eight five-bit pointer words. Each respective state machine PROM, 112 and 114 can store thirty-two fourteen-bit words. Of the fourteen-bits, eight-bits are used as timing waveform outputs; five-bits are used for selecting a next address location in a respective state machine PROM; and one-bit is used as a stop signal bit. Each respective output block 106 is programmed to select either waveform signals provided by the respective state machine PROMs 112 or 114, lower resolution waveform signals provided by respective counter circuits 136 or 136', higher resolution waveform signals provided by respective adjust logic circuits 140 or 140', or some combination of these signals. An output signal waveform is derived from the selected signals and is provided on an output line such as line $t_0$.

More specifically, binary signals are provided to an upper latch 116 on lines $p_0$ and $p_1$ to select one of the four possible binary pointer words in the upper mapping PROM 108. Similarly, binary signals are provided on lines $p_2$, $p_3$ and $p_4$ to lower latch 118 in order to select one of eight possible binary pointer words in the lower mapping PROM 110. Upon the application of an appropriate signal on line $TRIG_1$ to a trigger logic circuit 120, address bits $p_0$ and $p_1$ are latched into the upper latch 116, and are used to address a binary pointer word in the upper mapping PROM 108. Similarly, upon the application of an appropriate signal on line $TRIG_2$ to a trigger logic circuit 120; address bits $p_2$ $p_3$ and $p_4$ are latched into a lower latch circuit 118 and are used to address a binary pointer word in the lower mapping RPOM 110. The mapping PROMs 108 and 110 provide the respective addressed five-bit binary pointer words to respective multiplexers 126 and 126'.

Referring generally to the upper section 98, a control logic circuit 122 is coupled to the trigger logic circuit 120 by line 121. It is coupled to the multiplexer 126 by control line 127. It is coupled to the clock control circuit by lines 123 and 134.

In operation, the trigger logic circuit 120 provides a signal to the control logic circuit 122 causing it to command the multiplexer 126 to select a five-bit binary pointer word provided by the mapping PROM 126, and to provide the word as a five-bit address signal to the state machine PROM 112.

The clock circuit 104 includes a phase-locked loop oscillator (not shown) which can generate timing signals described below in a manner which is well known to those skilled in the art. The clock control circuit 104 provides timing signals on line 133 to the trigger logic circuit 120 and on line 123 to the control logic circuit 122 such that the control logic circuit 122 is caused to delay enabling the multiplexer 126 as described above, until the mapping PROM 108 has had sufficient time to generate the pointer word in response to signals input on lines $p_0$ and $p_1$.

The state machine PROM 112 receives address signals from the multiplexer 126 and commences the provision of a sequence of fourteen-bit output signals to register 128. Once a sequence has begun, the register feeds back five address bits to the multiplexer 126 for each fourteen-bit binary word provided by the state machine PROM 112. The control logic circuit 122 now commands the multiplexer 126 to provide this five-bit address word to the state machine PROM 112 as the next address in the sequence. The sequence continues until the state machine PROM 112 provides a stop bit characterized by a logical level "1" on line 129 to gate circuit 130. As will be explained more fully below, a signal on line 131 normally is at a logical level "1". Upon receiving the stop bit, the gate circuit 130 provides on line 132 to the control logic circuit 122 a signal causing the control logic circuit 122 to command the multiplexer 126 to stop providing address signals to the state machine PROM 112. Thus, the sequence is terminated.

Alternatively, the sequence can be terminated by the provision of an appropriate signal on the line labelled $TRIG_1$. The trigger logic circuit 120 then will provide on line 121 a signal causing the control logic circuit 122 to command the multiplexer 126 to stop sending address signals to the state machine PROM 112. Thus, the sequence can be terminated without the provision of a stop bit.

The register 128, as described above, provides eight register signals for each step in a given sequence. One of the register signals is provided to the counter circuit 136. Furthermore, each respective register signal is provided to a respective gate circuit 138 (only one of which is shown).

The state machine PROM 112 has a minimum cycle time of approximately eight nanoseconds. Thus, register signals provided directly by the register 128 are characterized by pulse widths of approximately eight nanoseconds. The counter circuit 136 is a programmable circuit which can be programmed to provide on line 144 a counter signal which has a pulse width which is some desired multiple of eight nanoseconds. Finally, the adjust logic circuit 140 can be programmed to provide on eight respective lines 142 respective signals characterized by pulse widths which are adjustable in one nanosecond intervals to have pulse widths of between one and eight nanoseconds. Thus, it will be appreciated that the counter circuit 136 can provide signals characterized by lower resolution than signals provided by the register 128; while the adjust logic circuit 140 can provide signals characterized by higher resolution.

More particularly, the counter 136 can be programmed in a manner well-known to those skilled in the art, for example, by blowing appropriate fuses. The counter 136, as explained above, receives register signals on a single line and provides corresponding counter signals on line 144. Normally, the counter 136 provides a logical-level "1" signal on line 144. Line 144 is coupled to a respective input terminal of each of the respective gate circuit 138. Consequently, it will be appreciated that normally each respective gate circuit 138 will provide on its respective line 145 a signal characterized by a logical level which is the same as that of a respective register signal provided to the respective gate circuit 138 by the register 128.

The counter circuit 136, however, can be programmed, for example, to count some desired time period which is a multiple of eight nanoseconds before providing a logical-level "1" signal and thereby to delay the provision of a logical level "1" signal on respective lines 145. It will be appreciated, of course, that the counter circuit 136 can be programmed in an alternative manner well-known to those skilled in the art, for example, such that a signal on line 144 normally is at logical-level "0", and that a logical-level "1" signal on respective lines 145 can be made to extend for a time period which is a multiple of eight nanoseconds.

The adjust logic circuit 140 receives control signals on line 146 from the clock control circuit 104, and it receives on respective lines 145 respective signals provided by the respective gate circuits 138.

Referring to FIG. 7, there is shown an illustrative drawing of a logic section 148 which represents one of eight such sections comprising the adjust logic circuit 140. The logic section 148 includes a programmable multiplexer 150 connected as shown, to receive eight input lines, two from each of four respective gates 152–158, and to provide an output signal to logic gate 160. The respective gates 152–158 each are coupled to successive output terminals of a counter (also known as a switched-tail ring counter) indicated generally by the numeral 162. The counter 162, for example, may comprise a component of a phase-locked loop oscillator (not shown) within the clock control circuit 104.

More specifically, gate 158 is coupled near the end of the illustrated Johnson counter 162 after gate 164 and provides complementary outputs D and $\overline{D}$. C. Gate 156 is coupled to the counter 162 between gates 164 and 166 and provides complementary outputs C and Gate 154 is coupled between gates 166 and 168 and provides complementary outputs B and $\overline{B}$. Gate 152 is coupled near the beginning of the illustrated Johnson counter 162 between gates 168 and 170 and provides complementary outputs A and $\overline{A}$.

From the illustrative timing diagram of FIG. 8, it will be appreciated that the delay introduced by the Johnson counter 162 between each pair of adjacent gates, 152 and 154, 154 and 156, and 156 and 158, is approximately one nanosecond. Furthermore, it will be appreciated that, for example, gate 152 provides complementary A and $\overline{A}$ signals simultaneously, and that it, therefore, simultaneously provides a positive-going and a negative-going edge of a signal.

The multiplexer 150 is programmable in a manner well-known to those skilled in the art, by blowing appropriate fuses, for example, such that a signal provided to the logic gate 160 can have a positive-going or negative-going edge at substantially any one nanosecond interval within the eight nanosecond time period shown in the illustrative timing diagram of FIG. 8, and can have a pulse width varying between one and eight nanoseconds within that eight nanosecond period. Referring to the drawing of FIG. 7, it will be seen that a respective corresponding signal from a gate circuit 138 is provided on a respective line 145 to an input terminal of logic gate 160 in order to provide an adjust logic circuit output signal on a respective line 142.

Referring once again to FIG. 6, it will be appreciated that a signal provided by each respective gate circuit 138 on its respective output line 145 and a signal provided by the adjust logic circuit 140 on a corresponding respective line 142 both are provided to a multiplexer 172 within a corresponding output block 106. The multiplexer 172 is programmable in a manner well-known to those skilled in the art by blowing appropriate fuses, for example, to select either a signal received, from a corresponding gate circuit 138 or a signal received from the adjust logic circuit 140. The multiplexer 172 provides the selected signal to an "S" terminal of an RS latch 174. The latch 174, in turn, provides a corresponding output signal waveform on line $t_0$. The output signal waveform is derived in part from the signal provided to the "S" terminal of the RS latch 174.

From the drawing of FIG. 6, it will be apparent that the components comprising the respective upper and lower sections 98 and 100 are substantially identical. Therefore, components in the lower section 100 are identified with primed reference numerals identical to numerals denoting corresponding substantially identical components in the upper section 98. Furthermore, the discussion above regarding the upper section 98 applies to the lower section as well, and, therefore, will not be set forth herein.

Referring now generally to the lower section 100, a second output multiplexer circuit 176 receives signals on respective lines 145' and 142' provided by a respective gate circuit 138' and an adjust logic circuit 140'. The second output multiplexer 176 also is selectively programmable to select either the signal on respective line 145' or the signal on respective line 142'. The second output multiplexer 176 provides the selected signal to an R input terminal of the RS latch 174 which provides the corresponding output signal waveform on line $t_0$. The output signal is derived in part from the signal provided to the "R" terminal of the RS latch 174.

Each element of the upper section 98 is characterized by a delay which is substantially the same as that of a corresponding element in the lower section 100. For example, a delay through the upper state machine PROM 112 is substantially the same as a delay through the lower state machine PROM 114. Furthermore, lengths of lines connecting various components within the upper section 98 must be substantially the same as lengths of corresponding lines connecting corresponding components in the lower section 100. The reason for making upper and lower sections 98 and 100 substantially identical is to ensure that signals triggered simultaneously by respective trigger logic circuits 120 and 120' will arrive on respective lines 145, 145' and 142, 142' at substantially the same time so as to substantially avoid significant signal skew errors.

In operation, the first output multiplexer circuit 172 selects either a waveform signal provided directly by the register 128, a signal provided by the counter 136 or a signal provided by the adjust logic circuit 140. Similarly, the second output multiplexer circuit 176 selects one of three similar signals provided by register 128'; counter 136' or adjust logic circuit 140'. The output signal waveform provided on line $t_0$ by the RS latch 174 is derived from the respective signals selected by the first output multiplexer 172 and the second output multiplexer 176. Thus, by properly programming the components of the programmable event generator 74, a wide variety of output signal waveforms can be provided on each of eight output lines (only one of which is shown) of the programmable event generator 74.

Figure 9:
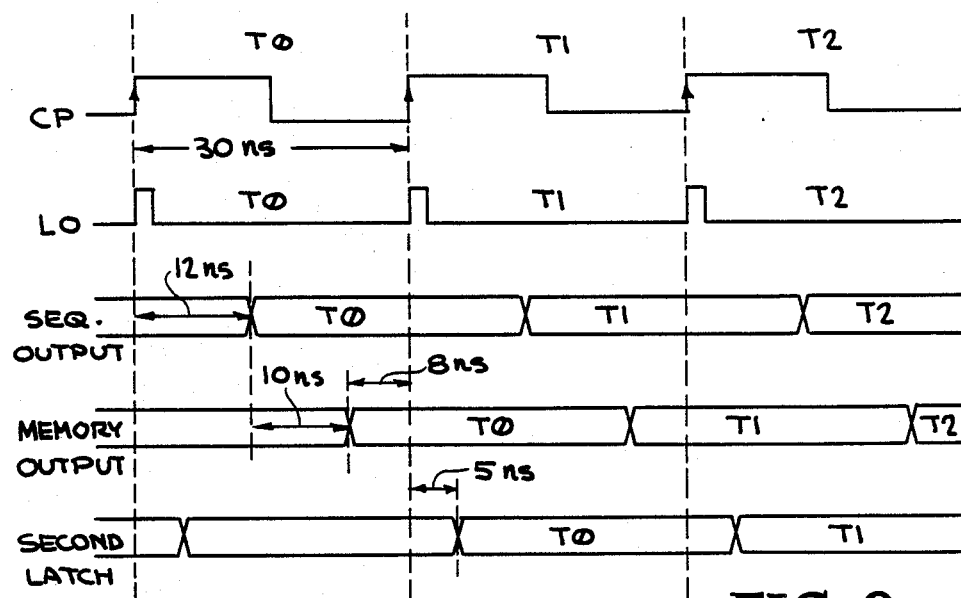
FIG. 9 is a first timing diagram for the embodiment of FIG. 5.
Figure 10:
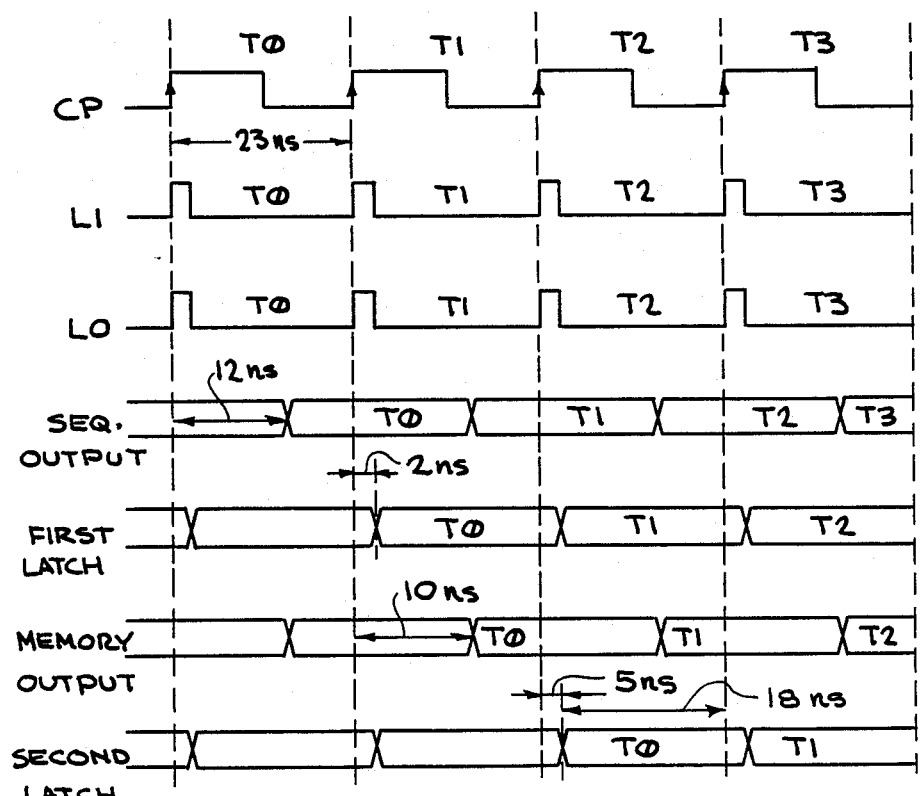
FIG. 10 is a second timing diagram for the embodiment of FIG. 5.

For example, referring to the timing diagrams of FIGS. 9 and 10, it will be appreciated that clock pulse signals CP could be generated on one of the eight output lines of the programmable event generator 74, for example, by deriving the CP signals from register signals, having an eight nanosecond time period, and from adjust logic circuit signals, having time periods between one and eight nanoseconds. Furthermore, the respective LO and LI signals (FIG. 10 only), for example, could be generated on other of the respective eight output lines by deriving the respective LO and LI signals from counter signals, having a time period which is a multiple of eight nanoseconds, and from adjust logic circuit signals.

Figure 11:
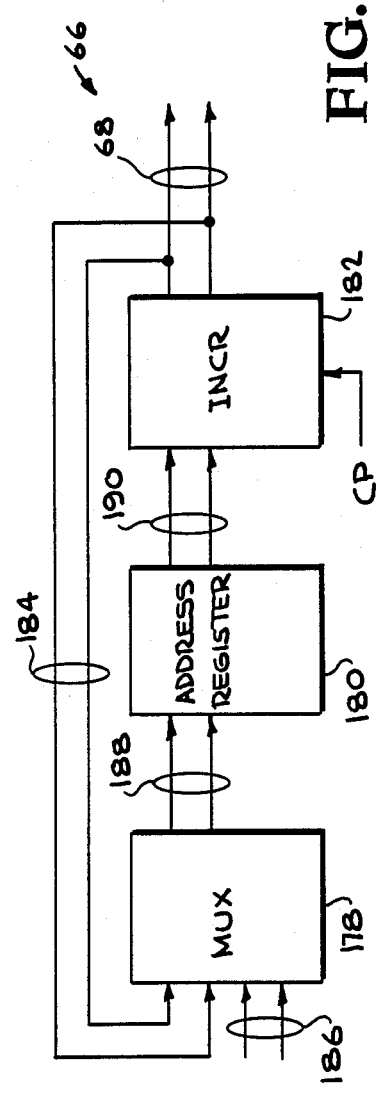
FIG. 11 is a block diagram of a sequencer of the embodiment of FIG. 5.

Referring now to the illustrative drawings of FIG. 11, there is provided a block diagram of the ECL sequencer 66. The sequencer 66 includes a multiplexer circuit 178, an address register 180 and an incrementor circuit 182. The multiplexer circuit 178 selects either feedback signals on feedback lines 184 or input signals on input lines 186. The selected signals are provided on lines 188 to the address register 180. The address register 180, in turn, provides the selected signals on lines 190 to the incrementor 182. A signal on lines 68 is provided in response to CP signals provided to incrementor 182 by the programmable event generator 74. The incrementor 182 increments the signal provided by the address register 180 and provides the incremented signal on lines 68. The signal on lines 68 is an address signal.

The sequencer 66, therefore, can provide a sequence of address signals on lines 66 either by merely incrementing a previous address through the selection of feedback lines 184 or by selecting alternative signals provided on lines 186. It will be appreciated that, in the preferred embodiment, there are ten lines 68 for addressing each ten-bit address location in the memory array 60.

Upon receiving on line 78 an appropriate LI signal, the first latch 56 provides on lines 58 address signals to the memory array 60. The address signals provided by the first latch 56 correspond to address signals provided by the sequencer 66 on lines 68. The memory array 60 provides on lines 64 output data signals corresponding to binary data stored at array locations addressed by the address signals on lines 58. Upon receiving on line 80 an appropriate LO signal, the second latch 62 provides on lines 72 system output signals to the ALU 70.

The timing diagrams of FIGS. 9 and 10 clearly illustrate that, by appropriate selection of timing signals from the programmable event generator 74, the respective first and second latches 56 and 62 of the integrated electronic memory circuit within dashed lines 54 advantageously can be made to behave as if they were registers. Thus, the system 52 constructed using ECL logic can be configured to be compatible with ECL register-based systems or to be compatible with more traditional ECL latch-based systems.

Referring now to the timing diagram of FIG. 9, the performance of the electronic memory system 52 is illustrated where an LI signal provided on line 78 by the generator 74 is permanently HIGH, rendering the first latch 56 essentially transparent to signals provided on line 68 by the sequencer 66. The programmable event generator 74 provides a clock pulse signal CP having a cycle time of approximately thirty nanoseconds. The drawings of FIG. 9 depict signals of the system 52 during three successive clock cycles, denoted in the drawing respectively as T0, T1 and T2. During one half of each cycle, the clock pulse signal is positive, and during the other half the clock pulse is negative. The LO signals comprise short pulses occurring one time during each cycle and having positive leading edges substantially synchronized with a leading edge of the clock signal CP. Each LO pulse measure only approximately two nanoseconds.

Referring to clock cycle T0, the sequencer 66 provides address signals approximately twelve nanoseconds after the provision of a positive leading edge of the clock signal CP. It will be appreciated that in the presently preferred embodiment the sequencer 66 has a set-up time of approximately eighteen nanoseconds, and a clock-to-output delay of approximately twelve nanoseconds. Approximately ten nanoseconds after the provision of the sequencer address signals on lines 68 (which pass through the transparent first latch 56 substantially without delay), the memory array 60 provides on lines 64 output data signals corresponding to memory locations addressed by the address signals provided by the sequencer 66.

Approximately eight nanoseconds later, at the beginning of clock cycle T1 at the positive edge of the clock signal pulse CP, another LO signal pulse is provided. The LO signal pulse triggers the second latch 62, which after a clock-to-output delay of approximately five nanoseconds, provides on lines 72 to the ALU 70, output signals provided by the memory array 60. It will be appreciated that during clock cycle T1, the clock signal CP triggers the sequencer 66 to provide another series of address signals on lines 68 to the memory array 60. Approximately twelve nanoseconds after the provision of the positive leading edge of the clock signal CP during clock cycle T1, the sequencer 66 provides the next series of address signals to the memory array 60, and approximately 10 nanoseconds after that, the array 60 provides corresponding output signals to the second latch 62.

During clock cycle T2, upon the provision of a next positive leading edge of the clock signal CP and the corresponding next LO signal pulse, the second latch 62 is triggered, and after a propagation delay of approximately five nanoseconds provides on line 72 to the ALU 70 a next set of system output signals.

Thus, it will be appreciated that the system 52, when controlled in the manner illustrated in FIG. 9, represents a single-level pipeline in that one set of data bits is being retrieved from a location in a memory array 60 while a system output signals corresponding to a previous set of data bits is being provided to the ALU 70 for execution. For example, referring to clock cycle T1 in FIG. 9, binary data corresponding to address signals provided during cycle T0 is being fetched from the array 20 while system output signals corresponding to address signals provided during cycle T1 are being provided by the second latch 62. Pipelining in this manner speeds memory-related functions.

It will be understood, that with the provision of very short LO signal pulses, the behavior of the second latch 62 is caused to be substantially identical to that of a register. Therefore, the integrated electronic memory circuit within dashed lines 54 substantially imitates the behavior of a circuit which includes a register for receiving output signals from the memory array 60; although the actual component used is a latch, the second latch 62.

Referring to the timing diagram of FIG. 10, the performance of the electronic memory system 52 is illustrated where the system 52 functions as a double-level pipeline As will be appreciated from the following discussion, the cycle time has been decreased to approximately twenty-three nanoseconds with the implementation of double-level pipelining.

Positive leading edges of a clock signal CP, LI signal pulses and LO signal pulses occur substantially simultaneously during each clock cycle. Each clock cycle measures approximately twenty-three nanoseconds in duration, and the clock signal is positive during one-half of each cycle and negative during the other half. The LO and LI signals comprise respective trains of pulses, each pulse measuring approximately two nanoseconds in duration, one pulse per train occurring during each cycle of the clock signal CP.

During clock cycle T0, the clock signal triggers the sequencer 66 to provide first address signals on lines 68. After a twelve nanosecond set-up time, the sequencer 66 actually provides the first address signals.

At the occurrence of the positive leading edge of clock signal CP during cycle T1, the sequencer 66 is triggered to provide second address signals after the usual set-up time delay. Furthermore, the LO signal triggers the first latch 56, which after approximately a two nanosecond propagation delay, provides, on lines 58 to the memory array 60, the first address signals. After an additional delay of approximately eight nanoseconds, the memory array 60 provides first output signals corresponding to binary data stored at memory locations addressed by the first address signals.

During clock cycle T2, the clock signal triggers the sequencer 66 to generate, after set-up time delay, third address signals. The LI signal triggers the first latch 56 to provide, after propagation delay, the second address signals to the memory array 60, which after approximately an eight nanosecond delay, provides corresponding second output signals. Meanwhile, the LO signal triggers the second latch 62 to provide on lines 72 first system output signals corresponding to the first address signals, after approximately a five nanosecond propagation delay.

Referring now to cycle T3, it will be appreciated that the system 52 functions as a double-level pipeline. During cycle T3, the clock signal CP triggers the sequencer 66 to generate fourth address signals; the LO signal triggers the first latch 56 to provide third address signals to the memory array 60; and the LI signal triggers the second latch 62 to provide second system output signals to the ALU 70. Thus, the implementation of a double-level pipeline further increases the speed at which binary information stored in the memory array 60 can be accessed.

The provision of very short LO and LI signals, causes the behavior of the respective first and second latches 56 and 62 to be substantially similar to that of registers. Thus, the respective latches 56 and 62 advantageously can behave like registers.

Figure 12:
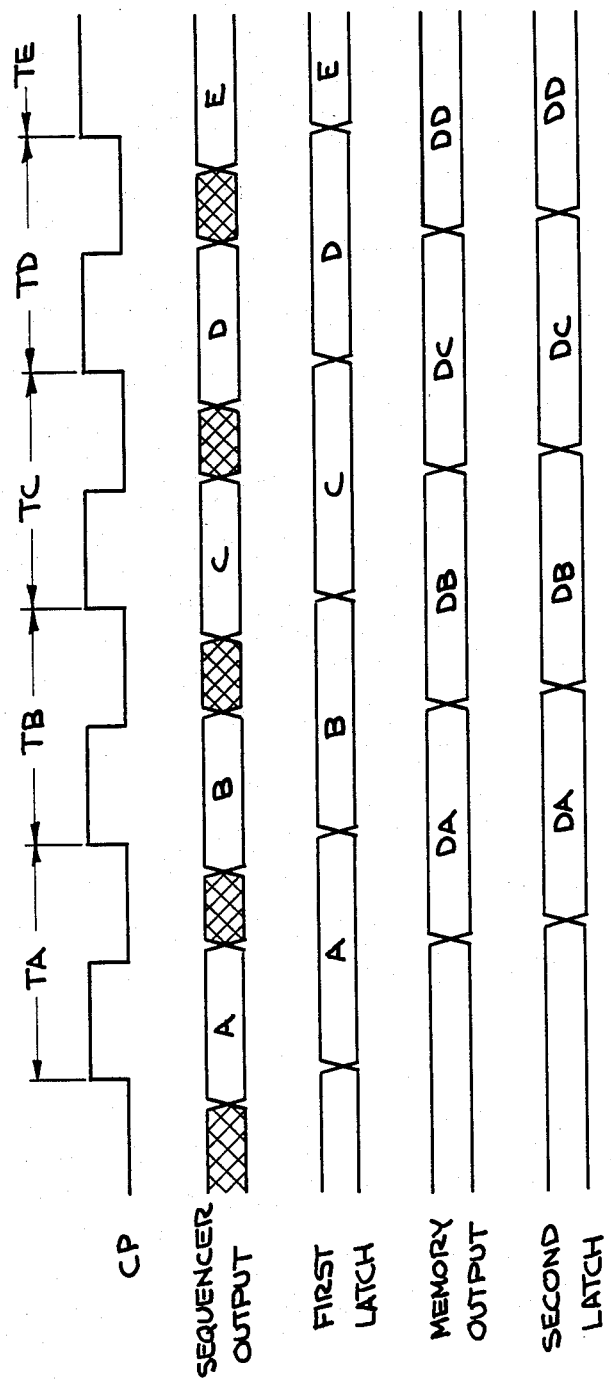
FIG. 12 is a third timing diagram for the embodiment of FIG. 5.

The timing diagram of FIG. 12 illustrates the operation of an electronic memory system 52 wherein the respective latches 56 and 62 behave like ordinary latches. As is explained more fully below, the respective first and second latches 56 and 62 are constructed so as to behave somewhat differently from the behavior illustrated in FIGS. 9 and 10, and the signals provided by the ECL programmable event generator 74 are different as well.

During time periods when the first latch 56 is enabled, the second latch 62 is disabled, and during time periods when the second latch 62 is enabled the first latch 56 is disabled. A clock signal CP is provided to both the respective first and second latches 56 and 62 on respective lines 78 and 80 and to the sequencer 66 on line 76. Furthermore, the first latch 56 is constructed so as to change state upon the provision of a rising edge of signal CP, and the second latch 62 is constructed so as to change state upon the provision of a falling edge of signal CP.

Signal CP is a square wave which includes positive and negative portions of equal time duration during each timing cycle. The system 52, when configured to function as illustrated in FIG. 12, responds to signal CP by using pipelining to achieve high-speed access to binary data stored in the memory array 60.

More particularly, during timing cycle TA, the sequencer 66 provides on lines 68 address signals corresponding to an address location denoted as location A for purposes of identification. Upon the provision of a first rising edge of signal CP during cycle TA, the first latch 56 changes state and provides on lines 68 address signals corresponding to memory location A to the memory array 60. Subsequently, as illustrated in the timing diagram of FIG. 12, the memory array 60 provides on lines 64 data signals, represented by the letters DA, corresponding to binary data stored at memory location A. Upon the provision of the falling edge of signal CP during cycle TA, the second latch 62 changes state and provides data signals DA as output signals on lines 72.

From FIG. 12, it will be appreciated that this basic sequence repeats for combinations of address signals provided during cycles TB, TC, TD and TE. Furthermore, it will be appreciated from the diagram that the system 52 utilizes pipelining techniques in order to speed the provision of output signals on lines 72 by the second latch 62 in response to address signals received on lines 68 by the first latch 56. Thus, as shown in FIG. 12, the system 52 can implement latches 56 and 62 as ordinary latches.

Therefore, the integrated electronic memory circuit 20, 44 of the present invention advantageously provides a write signal generator circuit 34, 34' which internally generates a write enable signal $\overline{WE}$ which causes input data to be provided to the memory array 22, 22'; the user, thus, is substantially freed from performing this often difficult task. Furthermore, the electronic memory access system 52 of the present invention includes an integrated electronic memory circuit 54 comprising a memory array 60 and at least one latch 62 which can be made to behave as if it were a register; the system 52, thus, is suitable for latch-based or for register-based systems and is suitable for utilizing pipelining techniques.

It will be understood that the above-described embodiments are merely illustrative of many possible specific embodiments which can represent the principles of the invention. Numerous and varied other arrangements can readily be devised in accordance with these principles without departing from the spirit and scope of the invention. For example, a memory access system could be constructed, in accordance with the present invention using TTL logic, which could be compatible with TTL register-based or latch-based systems. Thus, the foregoing description is not intended to limit the invention which is defined by the appended claims in which:

We claim:

1. An integrated electronic memory circuit operating in response to an external memory access signal, comprising:
    memory means for storing binary data in an array of memory locations, said memory means having a characteristic write time period during which data storage into said array is enabled;
    first data signal providing means for providing input data signals to said memory means, for storage by said memory means as binary data at respective memory locations; and
    write signal generator means internal to the integrated electronic memory circuit for generating, in response to said external memory access signal, an internal write signal during a prescribed time period causing said memory means to accept input data signals from said first data signal providing means for storage in said array, including means for adjusting the prescribed time period to substantially equal in time duration to said characteristic write time period, and in duration no longer than a time period during which said first data signal providing means provides input data signals to said memory means.

2. The integrated electronic memory circuit of claim 1 wherein said write signal generator means includes delay line means for delaying the external memory access signal.

3. The integrated circuit of claim 2 wherein said delay line means provides a time delay to the clock signal substantially equal to the prescribed time period.

4. The integrated electronic memory circuit of claim 1 further comprising:
    first means, internal to the integrated electronic memory circuit, for receiving a plurality of address signals and for providing said address signals to said memory means for addressing respective memory locations.

5. The integrated electronic memory circuit of claim 1 further comprising:
    second means internal to the integrated electronic memory circuit for receiving signals representing stored data of said memory means to provide circuit output signals.

6. The integrated electronic memory circuit as in claim 4 being coupled to means for selectively operating said first means as a register or a latch.

7. The integrated electronic memory circuit as in claim 5 being coupled to means for selectively operating said second means as a register or a latch.

8. An electronic memory access system comprising:
an integrated electronic memory circuit operating in response to an external memory access signal, comprising:
memory means for storing binary data in an array of memory locations, said memory means having a characteristic write time period during which data storage into said array is enabled;
first data signal providing means for providing input data signals to said memory means, for storage by said memory means as binary data at respective memory location;
write signal generator means internal to the integrated electronic memory circuit for generating, in response to said external signal, an internal write signal during a prescribed time period causing said memory means to accept input data signals from said first data signal providing means for storage in said array, including means for adjusting the prescribed time period to substantially equal in time duration to said characteristic write time period, and in duration no longer than a time period during which said first data signal providing means provides input data signals to said memory means;
a first means internal to the integrated electronic memory circuit for receiving address signals and providing said address signals to said memory means for addressing respective memory location; and
a second means internal to the integrated electronic memory circuit for receiving data signals representing stored data of said memory means to provide circuit output signals; and
control means coupled to said first means for selectively operating said first means as a latch or a register.

9. An electronic memory access system as in claim 8, further comprising control means coupled to said second means for selectively operating said second means as a latch or a register.

10. An electronic memory access system as in claim 8, wherein said control means comprises a programmable finite state machine.

* * * * *

UNITED STATES PATENT AND TRADEMARK OFFICE
CERTIFICATE OF CORRECTION

PATENT NO. : 4,825,416

DATED : April 25, 1989

INVENTOR(S) : Aloysius T. Tam, et al

It is certified that error appears in the above-identified patent and that said Letters Patent is hereby corrected as shown below:

Column 7, line 16 delete "FIG. 5" and insert therefor --FIG. 4--

Column 12, line 59 after and insert --C. --

Column 12, line 60 should not begin a new paragraph

Column 20, line 9 delete "location" and insert therefor --locations--

Signed and Sealed this

Tenth Day of April, 1990

Attest:

HARRY F. MANBECK, JR.

*Attesting Officer*  *Commissioner of Patents and Trademarks*